(12) United States Patent
Salmon

(10) Patent No.: US 9,961,452 B2
(45) Date of Patent: May 1, 2018

(54) MEMS MICROPHONE PACKAGE

(71) Applicant: Robert Bosch GmbH, Stuttgart (DE)

(72) Inventor: Jay S. Salmon, Pittsburgh, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days. days.

(21) Appl. No.: 15/305,519

(22) PCT Filed: Apr. 17, 2015

(86) PCT No.: PCT/US2015/026320
§ 371 (c)(1),
(2) Date: Oct. 20, 2016

(87) PCT Pub. No.: WO2015/164192
PCT Pub. Date: Oct. 29, 2015

(65) Prior Publication Data
US 2017/0048625 A1    Feb. 16, 2017

Related U.S. Application Data

(60) Provisional application No. 61/982,382, filed on Apr. 22, 2014.

(51) Int. Cl.
*H04R 25/00* (2006.01)
*H04R 19/04* (2006.01)
(Continued)

(52) U.S. Cl.
CPC .............. *H04R 19/04* (2013.01); *B81B 3/00* (2013.01); *B81B 7/00* (2013.01); *B81B 7/0061* (2013.01);
(Continued)

(58) Field of Classification Search
CPC .. B81B 3/00; B81B 7/00; H04R 1/021; H04R 17/005; H04R 2201/003
(Continued)

(56) References Cited

U.S. PATENT DOCUMENTS

2011/0165717 A1    7/2011   Lee et al.
2011/0210450 A1    9/2011   Theuss et al.
(Continued)

FOREIGN PATENT DOCUMENTS

JP    2011120170 A    6/2011
WO    2013071951 A1   5/2013

OTHER PUBLICATIONS

International Search Report corresponding to PCT Application No. PCT/US2015/026320, dated Jul. 22, 2015 (4 pages).

*Primary Examiner* — Brian Ensey
(74) *Attorney, Agent, or Firm* — Maginot Moore & Beck LLP

(57) ABSTRACT

In one embodiment a micro-electro-mechanical system (MEMS) microphone package includes a multiple layer substrate, an upper acoustic port formed through a plurality of upper layers of the multiple layer substrate and exposing an upper surface of a membrane portion, a lower acoustic port formed through a plurality of lower layers of the multiple layer substrate and exposing a lower surface of the membrane portion, a ring trench formed through at least one of the plurality of upper layers and exposing a metal ring, a MEMS die located above the ring trench, a copper pillar ring extending between the metal ring and the MEMS die, and a solder pillar ring positioned on a first surface of the copper pillar ring, the copper pillar ring and solder pillar ring attaching the MEMS die to the metal ring.

19 Claims, 4 Drawing Sheets

(51) Int. Cl.

| | | |
|---|---|---|
| *B81B 3/00* | (2006.01) | |
| *B81B 7/00* | (2006.01) | |
| *H04R 1/02* | (2006.01) | |
| *H04R 19/00* | (2006.01) | |
| *B81C 1/00* | (2006.01) | |
| *H04R 31/00* | (2006.01) | |

(52) U.S. Cl.
CPC ......... *B81C 1/00309* (2013.01); *H04R 1/021* (2013.01); *H04R 19/005* (2013.01); *H04R 31/003* (2013.01); *B81B 2201/0257* (2013.01); *B81C 2203/019* (2013.01); *H04R 2201/003* (2013.01)

(58) Field of Classification Search
USPC ....... 381/113, 174, 175, 189, 191, 355, 360, 381/369; 29/25.41, 25.42, 825; 257/433, 257/659, 678, 684, 690; 438/51, 53
See application file for complete search history.

(56) References Cited

U.S. PATENT DOCUMENTS

| | | | |
|---|---|---|---|
| 2012/0043629 A1* | 2/2012 | Minervini | B81B 7/0061 |
| | | | 257/416 |
| 2015/0304753 A1* | 10/2015 | Loeppert | H04R 1/04 |
| | | | 381/111 |
| 2015/0358735 A1* | 12/2015 | Klein | H04R 23/00 |
| | | | 257/416 |
| 2016/0066095 A1* | 3/2016 | Szczech | H04R 1/086 |
| | | | 381/174 |

* cited by examiner

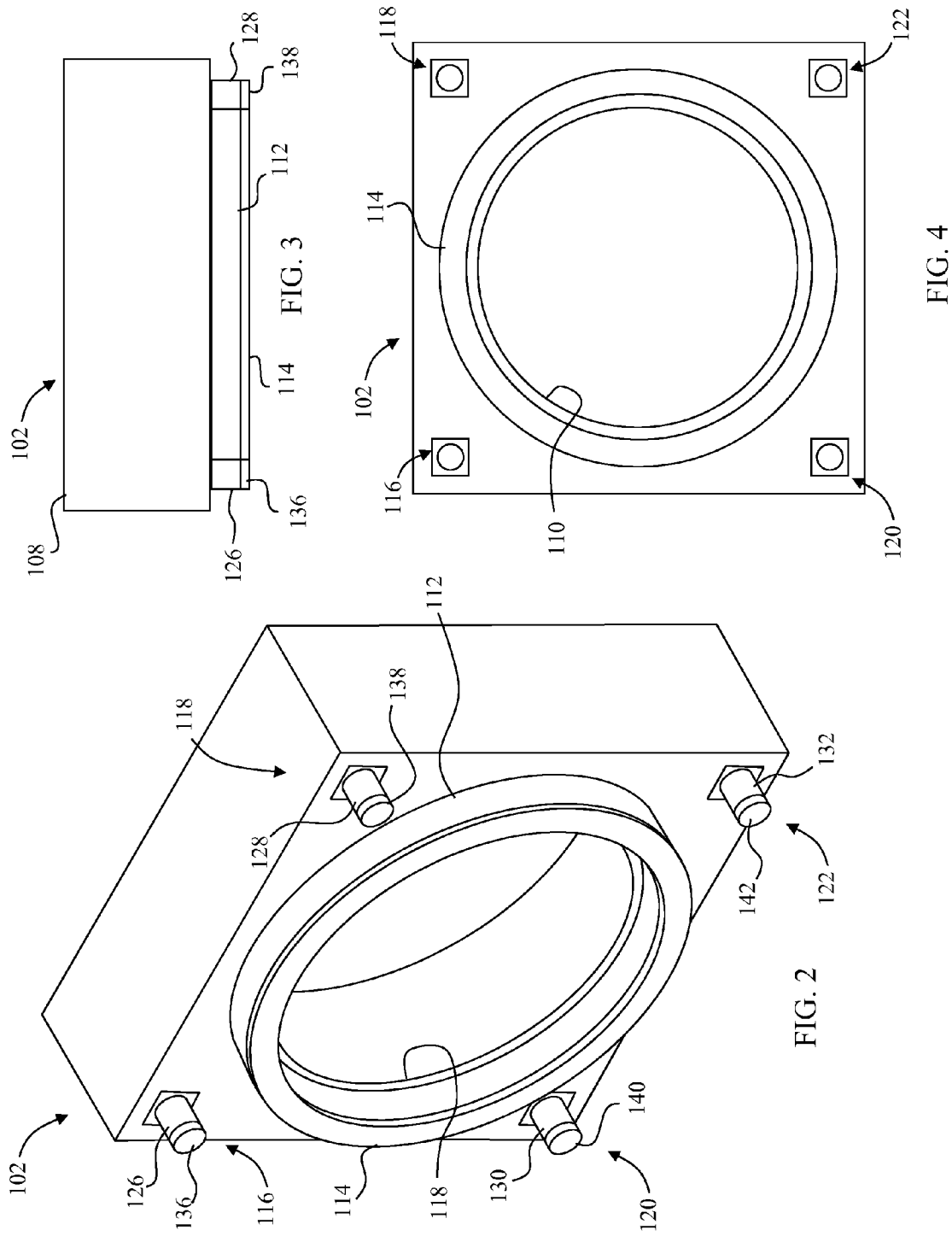

MEMS MICROPHONE PACKAGE

This application is a 35 U.S.C. § 371 National Stage Application of PCT/US2015/026320 filed on Apr. 17, 2015, which claims the benefit of priority to U.S. Provisional Application Ser. No. 61/982,382 filed Apr. 22, 2014, the disclosures of which are hereby incorporated herein by reference in their entireties.

FIELD OF THE DISCLOSURE

The present disclosure relates to microphones and in particular to MEMS microphones.

BACKGROUND

A MEMS device (micro-electro-mechanical system) is a miniaturized device which integrates mechanical and electrical functions in a chip or die of semiconductor material, for example of silicon. MEMS devices offer many advantages including miniaturization, and low manufacturing costs. These advantages are realized using micro-manufacturing lithographic techniques. The final assembled device is typically made of the silicon die wherein the MEMS device is integrated and, optionally, of integrated circuits for specific applications mounted on a substrate using conventional assembling processes.

A cover or cap, fixed to the substrate is typically formed by overmolding the MEMS device and any other devices mounted on the substrate, forming a casing which protects the MEMS device against external physical stresses.

Many types of sensors can be produced in a MEMS platform. One such sensor is a microphone. Many applications incorporate MEMS microphones including cellular telephones, laptops, etc. The attraction of MEMS microphones is the ability to provide a lightweight and small form factor microphone. Because of the low manufacturing costs and small footprint, MEMS microphones are increasingly replacing electric condenser microphones (ECMs). Additionally, a MEMS microphone has an inherent advantage of low power consumption (160 μA), which is approximately ⅓ of that of the ECM. For mobile phone and laptop applications with limited power storing capacity, the power savings available using MEMS microphones is significant.

One limitation of known MEMS microphones, however, is their susceptibility to damage from moisture. For example, in order to function properly, the sensor portion of the MEMS microphone must be configured to react to sound waves. By providing access for sound waves, however, an access is also provided for moisture.

What is needed, therefore, is MEMS microphone which provides protection to the sensor area against moisture. A need also exists for a MEMS microphone which provides a defined front volume that is compatible with epoxy overmold processes such as are common to standard semiconductor packages

SUMMARY

In one embodiment a micro-electro-mechanical system (MEMS) microphone package includes a multiple layer substrate, an upper acoustic port formed through a plurality of upper layers of the multiple layer substrate and exposing an upper surface of a membrane portion, a lower acoustic port formed through a plurality of lower layers of the multiple layer substrate and exposing a lower surface of the membrane portion, a ring trench formed through at least one of the plurality of upper layers and exposing a metal ring, a MEMS die located above the ring trench, a copper pillar ring extending between the metal ring on the substrate and the MEMS die, and a solder pillar ring positioned on a first surface of the copper pillar ring, the copper pillar ring and solder pillar ring attaching the MEMS die to the metal ring located on the substrate.

In one or more embodiments the membrane portion comprises a water resistant membrane portion.

In one or more embodiments the first surface is a lower surface of the copper pillar ring.

In one or more embodiments a MEMS microphone package includes a back cavity defined within the MEMS die and enclosed on an upper end portion by a cap positioned on an upper surface of the MEMS die.

In one or more embodiments the plurality of upper layers includes a first upper metal layer and an upper solder mask on an upper surface of the first upper metal layer, and a plastic overmold is positioned on an upper surface of the upper solder mask encasing the MEMS die.

In one or more embodiments the plastic overmold extends within the ring trench but does not pass beyond the copper seal ring connecting the MEMs die and substrate.

In one or more embodiments a MEMS microphone package includes at least one well extending through the upper solder mask, and at least one input/output post extending downwardly from the MEMS die into that well, the input/output post including an upper copper post portion soldered within the corresponding well using a solder post portion positioned on a lower surface of the upper copper post portion.

In one or more embodiments the plurality of upper layers comprises a middle Pre-preg organic layer, and a lower metal layer, the middle Pre-preg organic layer is located between the upper metal layer and the lower metal layer, a respective contact pad formed in the upper metal layer is located within each the described wells, and the corresponding input/output post is soldered to the respective contact pad located in the well.

In one or more embodiments a MEMS microphone package includes a metal acoustic seal ring positioned in the lower acoustic port.

In one or more embodiments a method of forming a MEMS microphone package includes forming an upper acoustic port through a plurality of upper layers of a multiple layer substrate to expose an upper surface of a membrane portion, forming a lower acoustic port through a plurality of lower layers of the multiple layer substrate to expose a lower surface of the membrane portion, forming a ring trench through at least one of the plurality of upper Pre-preg layers to expose a metal ring, positioning a MEMS die above the ring trench, and attaching the MEMS die to the metal ring using a copper pillar ring extending between the metal ring and the MEMS die, and using a solder pillar ring positioned on a first surface of the copper pillar ring.

In one or more embodiments forming the upper acoustic port includes forming the upper acoustic port through the plurality of upper layers of the multiple layer substrate to expose an upper surface of a water resistant membrane portion.

In one or more embodiments the method of forming a MEMS microphone package includes inserting the solder pillar ring into the ring trench, and reflowing the solder pillar ring.

In one or more embodiments the method of forming a MEMS microphone package includes defining a back cavity within the MEMS die, and enclosing an upper end portion of the back cavity with a cap.

In one or more embodiments the method of forming a MEMS microphone package includes providing the multiple layer substrate with a first upper metal layer and an upper solder mask on an upper surface of the first upper metal layer, and forming a plastic overmold on an upper surface of the upper solder mask thereby encasing the MEMS die.

In one or more embodiments forming the plastic overmold includes flowing the plastic overmold within the ring trench up to but not beyond the copper seal ring connecting the MEMs device to the substrate.

In one or more embodiments the method of forming a MEMS microphone package includes forming at least one well through the upper solder mask, and positioning at least one input/output post extending downwardly from the MEMS die into the described well, the described input/output post including an upper copper post portion and a lower solder post portion, and reflowing the lower solder post portion within the described well.

In one or more embodiments the method of forming a MEMS microphone package includes forming at least one pad within the upper metal layer, wherein forming the at least one well includes exposing the at least one pad.

In one or more embodiments providing the multiple layer substrate further includes providing a multiple layer substrate with a middle Pre-preg organic layer, and a lower metal layer, the middle Pre-preg organic layer located between the upper metal layer and the lower metal layer.

In one or more embodiments forming a lower acoustic port includes exposing a metal acoustic seal ring positioned on a lower pre-preg organic layer.

BRIEF DESCRIPTION OF THE DRAWINGS

FIG. 2 depicts a bottom perspective view of the MEMS die of FIG. 1 with the cap removed and showing the copper pillar ring;

FIG. 3 depicts a side plan view of the MEMS die of FIG. 2;

FIG. 4 depicts a bottom plan view of the MEMS die of FIG. 2;

DESCRIPTION

Figure 1:
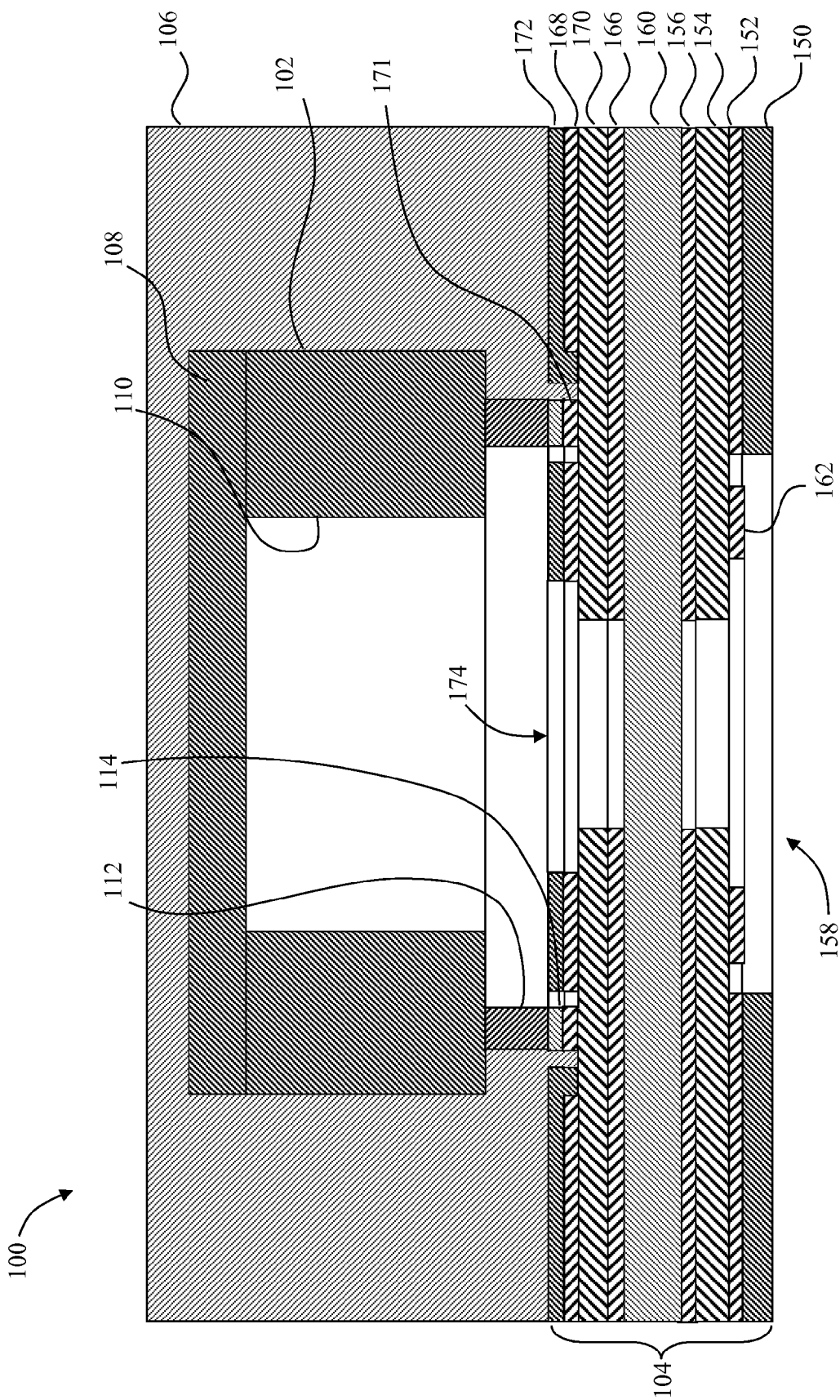
FIG. 1 depicts a side cross-sectional view of a MEMS microphone assembly incorporating an acoustically transparent water resistant membrane and a copper pillar ring which functions as an overmold dam and defines a microphone front volume.
Figure 5:
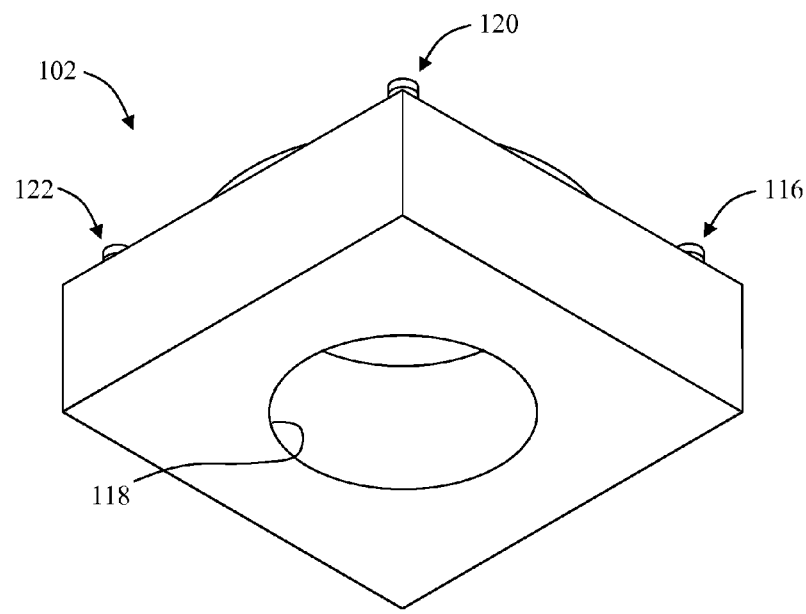
FIG. 5 depicts a top perspective view of the MEMS die of FIG. 2.

For the purpose of promoting an understanding of the principles of the disclosure, reference will now be made to the embodiments illustrated in the drawings and described in the following written description. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIG. 1 depicts a MEMS microphone assembly 100. The MEMS microphone assembly 100 includes a MEMS die 102 supported on a water resistant substrate 104 and encased in a plastic overmold 106. A cap 108 is positioned over a back-cavity 110 of the MEMS die 102. The MEMS die 102 further includes a downwardly extending copper pillar ring 112 shown in additional detail in FIGS. 2-5. At a lower distal end of the copper pillar ring 112 a solder pillar ring 114 is provided on a lower surface of the copper pillar ring 112. In some embodiments, the solder pillar ring is positioned at an upper surface of the copper pillar ring. The solder pillar ring 114 is used to attach the MEMS die 102 to the substrate 104 as discussed in further detail below.

The MEMS die 102 further includes four I/O posts 116, 118, 120, and 122. Each of the I/O posts 116, 118, 120, and 122 includes an upper copper post 126, 128, 130, and 132 and a lower solder post 136, 138, 140, and 142. The I/O posts 116, 118, 120, and 122 provide for electrical connection points between the MEMS die 102 and the substrate 104. In different embodiments, more or fewer I/O posts are included.

Figure 6:
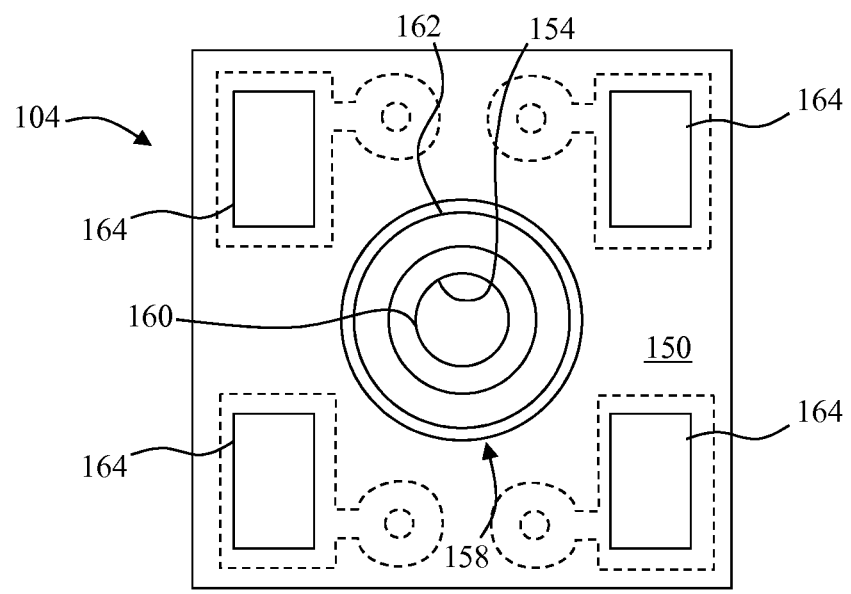
FIG. 6 depicts a bottom plan view of the substrate of FIG. 1.

Returning to FIG. 1, the substrate 104 is a multiple layer substrate. The bottom layer of the substrate 104 is a solder mask layer 150. A metal layer 152 is located on an upper surface of the solder mask layer 150. A pre-impregnated (Pre-preg) organic layer 154 is located between the metal layer 152 and another metal layer 156. Each of the lower layers 150, 152, 154, and 156 are perforated to form a lower acoustic port 158 which terminates at a water resistant membrane 160. The opening in the solder mask layer 150 and the metal layer 152 are larger than the openings in the other layers 154 and 156 to allow for a metal acoustic seal ring (pad) 162 positioned on the lower surface of the Pre-preg organic layer 154 as further shown in FIG. 6. Also shown in FIG. 6 are four package I/O pads 164. Typically, the acoustic seal ring 162 and the I/O pads 164 are formed from the metal layer 152.

Returning to FIG. 1, above the water resistant membrane 160, a pair of metal layers 166 and 168 sandwich an upper Pre-preg organic layer 170. An upper solder mask layer 172 is located on the upper surface of the metal layer 168. Each of the upper layers 172, 166, 168 and 170 are perforated to form an upper acoustic port 174 which terminates at the water resistant membrane 160. The upper acoustic port 174 is aligned with the lower acoustic port 158.

Figure 7:
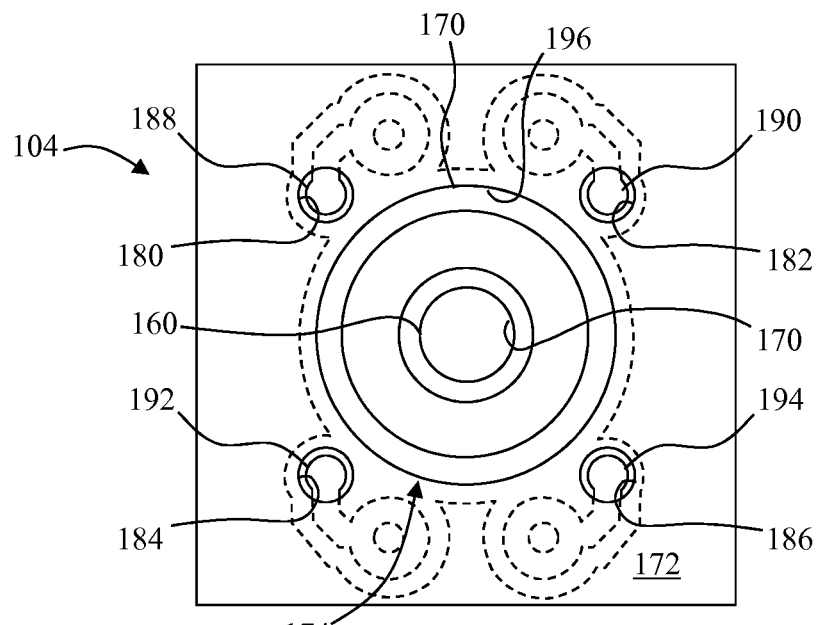
FIG. 7 depicts a top plan view of the substrate of FIG. 1.

With reference to FIG. 7, four wells 180, 182, 184, and 186 are formed through the upper solder mask layer 172 to expose portions of I/O pads 188, 190, 192, and 194 formed in the metal layer 168. A ring trench 196 is also formed through the upper solder mask layer 172 and the metal layer 168 to expose a ring of the Pre-preg organic layer 170 and form a metal ring 171.

Fabrication of the MEMS microphone assembly 100 is substantially accomplished using any desired fabrication processes. For example, electrical connections for the I/O pads 164 and the I/O pads 188, 190, 192, and 194 can be provided within the substrate 104 by the drilling of vias that are then filled with conductive epoxy or lined and plated using standard PCB via plating techniques. Likewise, the layers of the substrate 104 are sandwiched using any desired process. In at least one embodiment, however, the substrate 104 includes the water resistant membrane 160. The water resistant membrane 160 is an acoustically transparent breathable material which restricts the passage of moisture therethrough. In one embodiment, the water resistant membrane 160 is formed from Polytetrafluoroethylene (PTFE). Accordingly, fluid is hindered from moving into the MEMS die 102 through the acoustic ports 158 and 174.

One difference from known devices is the formation of the metal ring 171 using the ring trench 196 through the upper solder mask layer 172 and the metal layer 168. The ring 171 is configured to attach to the copper pillar ring 112 using the solder pillar ring 114 as depicted in FIG. 1 during a flip-chip assembly process. The copper pillar ring 112 and solder pillar ring 114 are formed, for example, using a modification of a process described in U.S. Pat. No. 6,681,982 which issued on Jan. 27, 2004. The modified '982 patent process is used in one embodiment to form the copper pillar ring 112 with a 80 µm height while the solder pillar ring 114 has a 20 µm height. The copper pillar ring 112 and the solder pillar ring 114 both have a 75 µm diameter. The I/O posts 116, 118, 120, and 122 are each formed in like manner to the copper pillar ring 112 and solder pillar ring 114.

Accordingly, when the MEMS die 102 is positioned on the substrate 104 during the flip-chip process, the lower solder posts 136, 138, 140, and 142 are positioned through the respective wells 180, 182, 184, and 186 and into contact with the respective I/O pad 188, 190, 192, and 194. Additionally, the solder pillar ring 114 is positioned through the ring trench 196 and into contact with the ring 171. The lower solder posts 136, 138, 140, and 142 are then connected to the respective I/O pad 188, 190, 192, and 194 using a reflow process. The solder pillar ring 114 is also connected to the ring 171 during the reflow process. The copper pillar ring 112 thus forms the microphone front volume in the finished assembly.

The cap 108 is then positioned on the upper end of the MEMS die 102 (see FIG. 1) and the plastic overmold is overmolded onto the MEMS die 102 and the upper solder mask layer 172. In some embodiments, the ring trench 196 is sufficiently larger than the copper pillar ring 112 so as to allow some of the plastic overmold 106 to flow into the well to provide increased bonding as depicted in FIG. 1.

The MEMS microphone assembly 100 thus provides a water proof seal between the MEMS die and the substrate, which may further include a water proof membrane integrated into a substrate such that an acoustic port that is water proof/resistant may be implemented at the package level. This is achieved by bonding two substrate cores that have pre-drilled acoustic port holes over a water proof breathable membrane. In some embodiments, the water proof breathable membrane is provided in the form of an insert.

Figure 8:
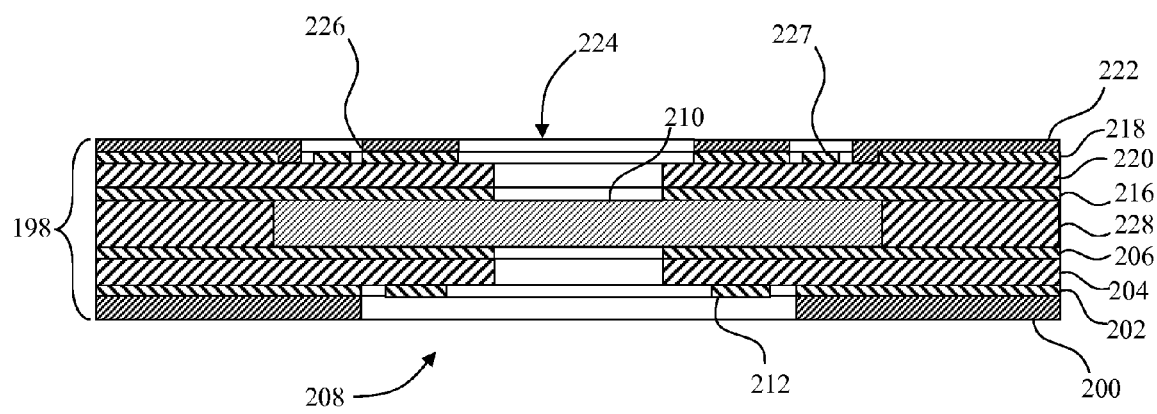
FIG. 8 depicts a side cross-sectional view of a substrate which can be used with the MEMS microphone assembly of FIG. 1.

By way of example, FIG. 8 depicts a substrate 198 which is used in the MEMS microphone assembly 100 in place of the substrate 104. The substrate 198 is a multiple layer substrate. The bottom layer of the substrate 198 is a solder mask layer 200. A metal layer 202 is located on an upper surface of the solder mask layer 200. A Pre-preg organic layer 204 is located between the metal layer 202 and another metal layer 206. Each of the layers 200, 202, 204, and 206 are perforated to form a lower acoustic port 208 which terminates at a water resistant membrane 210. The opening in the solder mask layer 200 and the metal layer 202 are larger than the openings in the other layers 204 and 206 to allow for a metal acoustic seal ring (pad) 212 located on the lower surface of the Pre-preg organic layer 204.

Above the water resistant membrane 210, a pair of metal layers 216 and 218 sandwich an upper Pre-preg organic layer 220. An upper solder mask layer 222 is located on the upper surface of the metal layer 218. Each of the layers 216, 218, 220 and 222 are perforated to form an upper acoustic port 224 which terminates at the water resistant membrane 210. The upper acoustic port 224 is aligned with the lower acoustic port 208. A ring trench 226 is formed through the upper solder mask layer 222 to expose a metal ring 227, and wells, vias, and I/O ports (not shown) are also provided. The substrate 198 is thus substantially the same as the substrate 104, and is assembled to the MEMS die 102 in like manner as the substrate 104. The main difference is that instead of a membrane layer, the water resistant membrane 210 is formed as an insert within a substrate core 228.

Both lower substrates allow for the provision of electrical connection between the top and bottom substrates in any desired manner such as by laser or mechanical drilling of vias that are then filled with conductive epoxy or lined and plated using standard PCB via plating techniques. The MEMS microphone assembly 100 further incorporates a copper pillar ring plated onto the MEMs die forms. This ring forms a barrier for subsequent processes when the die has been bonded to the substrate/chip carrier. Specifically, the ring forms an epoxy barrier during overmold processing of the microphone assembly.

The MEMS microphone assembly 100 thus provides a new semiconductor package form factor that incorporates wafer proof/resistant characteristics and allows for overmolded package construction. The package design in some embodiments further addresses a need for integrating a water-proof membrane into the porthole of a MEMs microphone package to prevent moisture damage. Additionally, the MEMS microphone assembly 100 provides a method for using a copper pillar seal ring to create a defined front volume that is compatible with epoxy overmold processes that are common to standard semiconductor packages.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A micro-electro-mechanical system (MEMS) microphone package comprising:
   a multiple layer substrate;
   an upper acoustic port formed through a plurality of upper layers of the multiple layer substrate and exposing an upper surface of a membrane portion;
   a lower acoustic port formed through a plurality of lower layers of the multiple layer substrate and exposing a lower surface of the membrane portion;
   a ring trench formed through at least one of the plurality of upper layers and exposing a metal ring;
   a MEMS die located above the ring trench;
   a copper pillar ring extending between the metal ring and the MEMS die; and
   a solder pillar ring positioned on a first surface of the copper pillar ring, the copper pillar ring and solder pillar ring attaching the MEMS die to the metal ring.

2. The MEMS microphone package of claim 1, wherein the membrane portion comprises a water resistant membrane.

3. The MEMS microphone package of claim 1, wherein the first surface is a lower surface of the copper pillar ring.

4. The MEMS microphone package of claim 1, further comprising:
   a back cavity defined within the MEMS die and enclosed on an upper end portion by a cap positioned on an upper surface of the MEMS die.

5. The MEMS microphone package of claim 1, wherein:
the plurality of upper layers includes a first upper metal layer and an upper solder mask on an upper surface of the first upper metal layer; and
a plastic overmold is positioned on an upper surface of the upper solder mask encasing the MEMS die.

6. The MEMS microphone package of claim 5, wherein:
the plastic overmold extends within the ring trench.

7. The MEMS microphone package of claim 5, further comprising:
at least one well extending through the upper solder mask; and
at least one input/output post extending downwardly from the MEMS die into the at least one well, the at least one input/output post including an upper copper post portion soldered within the at least one well using a solder post portion positioned on a lower surface of the upper copper post portion.

8. The MEMS microphone package of claim 7, wherein:
the plurality of upper layers comprises a middle Pre-preg organic layer, and a lower metal layer;
the middle Pre-preg organic layer is located between the upper metal layer and the lower metal layer;
a respective contact pad formed in the upper metal layer is located within each of the at least one wells; and
the at least one input/output post is soldered to the respective contact pad.

9. The MEMS microphone package of claim 8, further comprising:
a metal acoustic seal ring positioned in the lower acoustic port.

10. A method of forming a micro-electro-mechanical system (MEMS) microphone package comprising:
forming an upper acoustic port through a plurality of upper layers of a multiple layer substrate to expose an upper surface of a membrane portion;
forming a lower acoustic port through a plurality of lower layers of the multiple layer substrate to expose a lower surface of the membrane portion;
forming a ring trench through at least one of the plurality of upper Pre-preg layers to expose a metal ring;
positioning a MEMS die above the ring trench; and
attaching the MEMS die to the metal ring using a copper pillar ring extending between the metal ring and the MEMS die, and using a solder pillar ring positioned on a first surface of the copper pillar ring.

11. The method of claim 10, wherein forming the upper acoustic port comprises:
forming the upper acoustic port through the plurality of upper layers of the multiple layer substrate to expose an upper surface of a water resistant membrane portion.

12. The method of claim 10, further comprising:
inserting the solder pillar ring into the ring trench; and
reflowing the solder pillar ring.

13. The method of claim 10, further comprising:
defining a back cavity within the MEMS die; and
enclosing an upper end portion of the back cavity with a cap.

14. The method of claim 10, further comprising:
providing the multiple layer substrate with a first upper metal layer and an upper solder mask on an upper surface of the first upper metal layer; and
forming a plastic overmold on an upper surface of the upper solder mask thereby encasing the MEMS die.

15. The method of claim 14, wherein forming the plastic overmold comprises:
flowing the plastic overmold within the ring trench.

16. The method of claim 15, further comprising:
forming at least one well through the upper solder mask; and
positioning at least one input/output post extending downwardly from the MEMS die into the at least one well, the at least one input/output post including an upper copper post portion and a lower solder post portion; and
reflowing the lower solder post portion within the at least one well.

17. The method of claim 16, further comprising:
forming at least one pad within the upper metal layer, wherein forming the at least one well comprises:
exposing the at least one pad.

18. The method of claim 17, wherein providing the multiple layer substrate further comprises:
providing a multiple layer substrate with a middle Pre-preg organic layer, and a lower metal layer, the middle Pre-preg organic layer located between the upper metal layer and the lower metal layer.

19. The method of claim 18, wherein forming a lower acoustic port comprises:
exposing a metal acoustic seal ring positioned on a lower pre-preg organic layer.

* * * * *